US009635793B2

(12) United States Patent
Mizokami

(10) Patent No.: US 9,635,793 B2
(45) Date of Patent: Apr. 25, 2017

(54) COMPONENT MOUNTING METHOD AND COMPONENT MOUNTING DEVICE

(71) Applicant: Panasonic Corporation, Osaka (JP)

(72) Inventor: Daisuke Mizokami, Yamanashi (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 289 days.

(21) Appl. No.: 14/447,147

(22) Filed: Jul. 30, 2014

(65) Prior Publication Data

US 2015/0033555 A1 Feb. 5, 2015

(30) Foreign Application Priority Data

Aug. 5, 2013 (JP) .................................. 2013-162103

(51) Int. Cl.
H05K 13/04 (2006.01)

(52) U.S. Cl.
CPC ...... H05K 13/0417 (2013.01); *Y10T 29/4913* (2015.01); *Y10T 29/53178* (2015.01)

(58) Field of Classification Search
CPC ............ H05K 13/0417; G05B 19/4183; Y10T 29/4913; Y10T 29/53178
See application file for complete search history.

(56) References Cited

U.S. PATENT DOCUMENTS 5,553,376 A * 9/1996 Solanki .............. H05K 13/0417
29/709

FOREIGN PATENT DOCUMENTS

JP H10-65399 A 3/1998
JP 2000-068697 A 3/2000

* cited by examiner

*Primary Examiner* — Livius R Cazan
(74) *Attorney, Agent, or Firm* — Pearne & Gordon LLP

(57) ABSTRACT

A component mounting method includes: detecting feeder ID information of a parts feeder, which individually specifies a parts feeder, after a second parts feeder is attached to an attaching position of the feeder base having a feeder address, and confirming whether the second parts feeder is the same as a first parts feeder which was attached to and then detached from the attaching position; and calculating an attaching/detaching time from detachment of the first parts feeder to attachment of the second parts feeder if it is confirmed that the second parts feeder is the same as the first parts feeder. If the calculated attaching/detaching time is a given time or shorter, the mounting work is performed without performing a component checking operation which determines whether a kind of an electronic component accommodated in the second parts feeder is proper.

4 Claims, 5 Drawing Sheets

COMPONENT MOUNTING METHOD AND COMPONENT MOUNTING DEVICE

BACKGROUND

1. Technical Field

An aspect of the present invention relates to a component mounting method and a component mounting device for performing a mounting work in which an electronic component is picked up from a parts feeder attached to a feeder base of a component supply unit and is mounted on a board.

2. Background Art

In the component mounting device used for manufacturing an electronic board, a mounting work is repeatedly performed. In the mounting work, an electronic component is picked up from a parts feeder and is mounted on the board. An example of a parts feeder is a tape feeder attachable to a feeder base of a component supply unit. In the component supply unit, when new components are supplied or a kind of the component is changed, a work for attaching and detaching the tape feeder is performed as required. When the component attaching and detaching work is performed, a component checking operation is usually performed. In the component checking operation, an attached position of the tape feeder and the kind of the electronic component as an object to be fed is recognized in order to prevent the tape feeder from being erroneously set (for example, see JP-A-2000-068697).

JP-A-2000-068697 describes a component exchange work is performed when the components run out. In the component exchange work, a parts feeder to be exchanged in which the components run out is identified and reported to an operator. The operator who receives the report reads barcodes provided in the parts feeder to be exchanged and a parts feeder of exchanging components by a barcode reader and performs the component exchange work only when item numbers of both the components correspond to each other. Thus, a wrong exchange of the parts feeder can be advantageously prevented.

SUMMARY

However, in the usual technique including the above-described related art, since the component checking operation is always required when the tape feeder is attached to the feeder base, below-described disadvantages arise. In a component mounting line, there is a case in which the tape feeder is detached and a new tape feeder is then attached due to a changeover of kinds of the product or a running out of the components. There is also a case in which the tape feeder already attached is temporarily detached from the feeder base owing to various reasons in the course of a production. For example, when a mistake in suction of the component occurs in a specific tape feeder during the production, an operation in which the tape feeder is pulled out from the feeder base is performed to visually check whether there is an abnormality in a component sucking position at a leading end. After the check, the tape feeder is reattached to the same attached position on the feeder base.

In this case, since a component supply reel set in the tape feeder is not replaced by a different component supply reel, the components do not essentially need to be checked. However, in the usual technique, the component checking operation is required irrespective of a reason of detachment of the parts feeder such as the tape feeder. Thus, even when the parts feeder is temporarily detached, an operator is forced to perform a complicated work. Consequently, a working efficiency is caused to be deteriorated.

An object of an aspect of the present invention is to provide a component mounting method and a component mounting device which can reduce a working load and improve a working efficiency when a parts feeder is temporarily detached.

According to an aspect of the present invention, there is provided a component mounting method for performing a mounting work in which an electronic component is picked up from a parts feeder attached to a feeder base of a component supply unit and is mounted on a board, the component mounting method including: detecting feeder ID information of a parts feeder, which individually specifies a parts feeder, after a second parts feeder is attached to an attaching position of the feeder base having a feeder address, and confirming whether the second parts feeder is the same as a first parts feeder which was attached to and then detached from the attaching position having the same feeder address during the mounting work; and calculating an attaching/detaching time from detachment of the first parts feeder to attachment of the second parts feeder if it is confirmed that the second parts feeder is the same as the first parts feeder, wherein if the calculated attaching/detaching time is a given time or shorter, the mounting work is performed without performing a component checking operation which determines whether a kind of an electronic component accommodated in the second parts feeder is proper.

According to another aspect of the present invention, there is provided a component mounting device for performing a mounting work in which an electronic component is picked up from a parts feeder attached to a feeder base of a component supply unit and is mounted on a board, the component mounting device including: a component mounting mechanism which performs the mounting work; a feeder ID information confirming unit which detects feeder ID information, which individually specifies a parts feeder, after a second parts feeder is attached to an attaching position of the feeder base having a feeder address, and which confirms whether the second parts feeder is the same as a first parts feeder which was attached to and then detached from the attaching position having the same feeder address during the mounting work; an attaching/detaching time calculating unit which calculates an attaching/detaching time from detachment of the first parts feeder to attachment of the second parts feeder if the feeder ID information confirming unit confirms that the second parts feeder is the same as the first parts feeder; and a control unit which controls the component mounting mechanism, the feeder ID information confirming unit and the attaching/detaching time calculating unit, wherein if the calculated attaching/detaching time is a given time or shorter, the control unit controls the component mounting mechanism to perform the mounting work without performing a component checking operation which determines whether a kind of an electronic component accommodated in the second parts feeder is proper.

According to aspects of the present invention, for example, in a feeder temporarily detaching operation in which the parts feeder is temporarily detached from the feeder base and reattached to the same attached position while the mounting operation is performed, after the parts feeder is attached again to the feeder base, the feeder ID information which individually specifies the parts feeder is detected to confirm whether the reattached (second) parts feeder is the same as the prior (first) parts feeder which was attached to and detached from the feeder base. When it is confirmed that the reattached parts feeder is the same as the prior parts feeder, an attaching/detaching time from the detachment of the prior (first) parts feeder to the reattachment of the reattached (second) parts feeder is calculated. If the calculated attaching/detaching time is a given time or shorter, the mounting operation is performed without the component checking operation for determining whether the kind of the electronic component accommodated in the parts feeder is correct. Consequently, an execution of an unnecessary component checking operation is eliminated, and a working load can be reduced and a working efficiency can be improved in the temporary detachment of the parts feeder.

DETAILED DESCRIPTION

Figure 1:
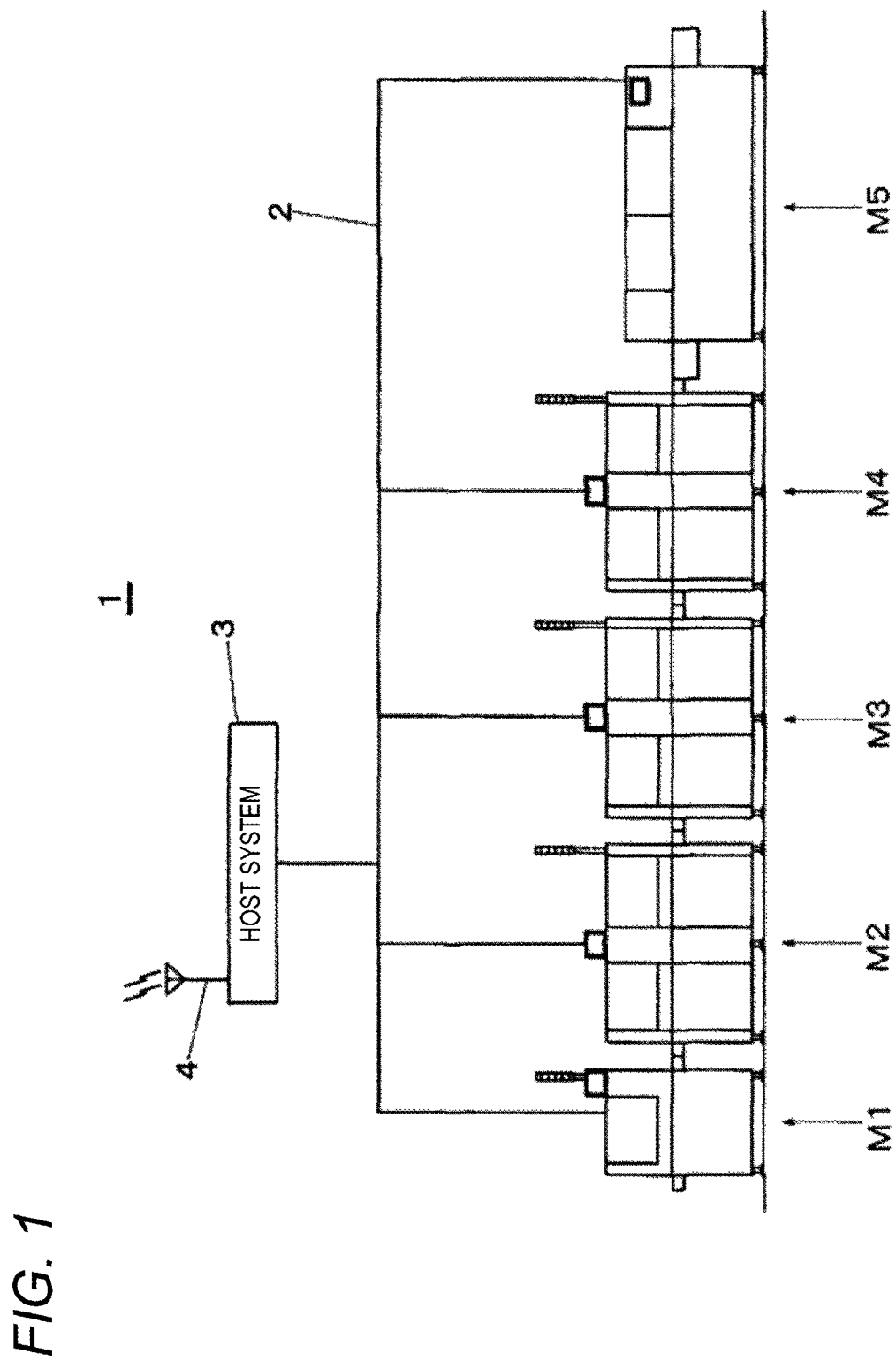
FIG. 1 is a front view of an electronic component mounting system of an exemplary embodiment of the present invention.

An exemplary embodiment of the present invention will be described below with reference to the drawings. Initially, with reference to FIG. 1, a component mounting system will be described. In FIG. 1, the component mounting system 1 has a function which mounts electronic component on a board to manufacture a mounting board. The component mounting system 1 includes a component mounting line formed by connecting devices as follows: a printing device M1, component mounting devices M2 to M4 and a reflow device M5. The devices are connected by a communication network 2 such that an entire system is controlled by a host system 3. Further, the host system 3 includes a wireless receiver 4 which receives an input signal wirelessly transmitted from a portable terminal device such as a barcode reader.

The printing device M1 screen-prints paste type solder on electrodes for connecting the electronic component formed on the board. Each of the component mounting devices M2 to M4 picks up the electronic component from a component supply unit by a mounting head, and moves and mounts the electronic component to a mounting position of the board on which the solder is printed. After that, the board on which the component is mounted is fed to the reflow device M5 to connect the electronic component mounted on the board to the board by the solder so that the mounting board is manufactured.

Figure 2A:
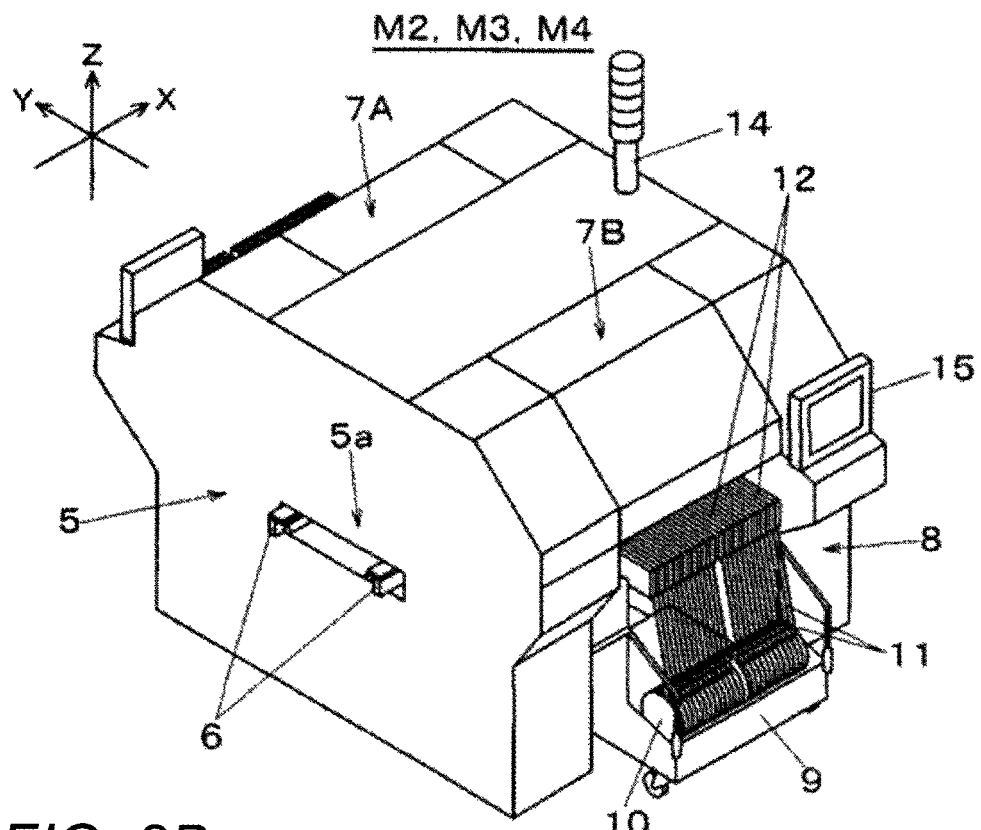
FIG. 2A is a perspective view of a component mounting device which forms the electronic parts mounting system of the exemplary embodiment of the present invention.
Figure 2B:
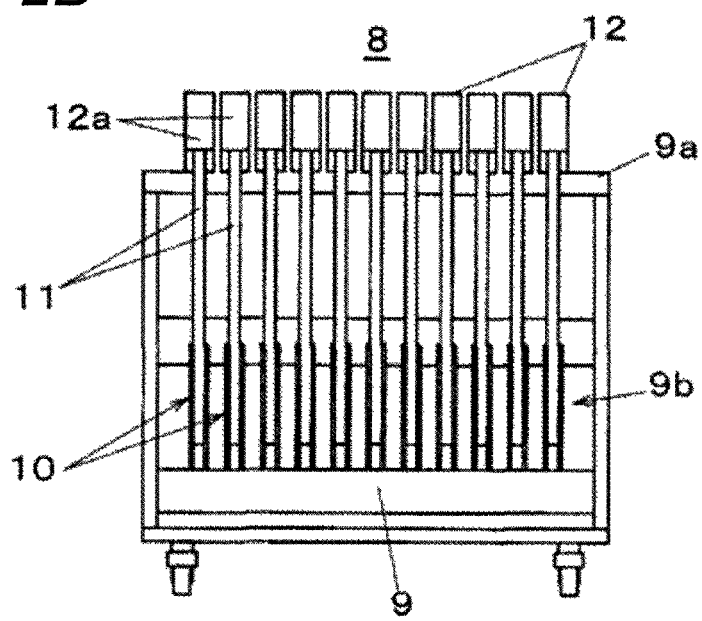
FIG. 2B is a structure diagram of a component supply unit.

With reference to FIGS. 2A and 2B, the component mounting devices M2 to M4 and a structure of the component supply unit provided in each of the component mounting devices M2 to M4 will be described. As shown in FIG. 2A, each of the component mounting devices M2 to M4 includes a main body 5. In an end portion in a direction X (a board conveying direction) of the main body 5, an opening portion 5a for inputting the board is provided. In the main body 5, a board conveying mechanism 6 is provided. The board conveying mechanism 6 includes a pair of conveyors extending in the direction X and penetrating through the opening portion 5a.

In the main body 5, component mounting mechanisms 7A and 7B are arranged at both sides of the board conveying mechanism 6. Each of the component mounting mechanisms 7A and 7B includes the mounting head (not shown) which picks up the electronic component from the component supply unit 8, moves and mounts the electronic component on the board which is input through the opening portion 5a and positioned and held. An outer side surface of the component mounting mechanisms 7A and 7B serves as an operating side surfaces for operating the component mounting devices M2 to M4. In the operating side surface, the component supply unit 8 for supplying the component and the operating panel 15 for inputting an operation are provided. Further, on an upper surface of the main body 5, a display lamp 14 upstands. The display lamp 14 is lighted and displayed for informing an operator.

In the component supply unit 8, a carriage 9 is detachably set. Tape feeders 12 serving as a plurality of parts feeders are attachable in parallel to the carriage 9. The parts feeder may be a feeder having a compatibility of attachment with the tape feeder 12, such as a bulk feeder or a tube feeder. In the carriage 9, a plurality of reels 10 are set. In the real 10, a carrier tape 11 is wound and accommodated. The carrier tape 11 holds electronic components as objects to be mounted. In the component supply unit 8, when the components are expected to run out in any of the tape feeders 12 during an operation of the device, the display lamp 14 is turned on to inform the operator that the components are expected to run out. The operator who receives the information performs a reel exchange work. In the reel exchange work, the reel 10 in which the components run out of stock is exchanged for a new reel 10 for the tape feeder 12 which is informed that the components are expected to run out of stock.

FIG. 2B shows the carriage 9 set in the component supply unit 8, and an arranged state of the tape feeders 12 attached to the carriage 9 and an arranged state of the reels 10 which supply the carrier tapes 11 to the tape feeders 12. On a feeder base 9a provided in an upper surface of the carriage 9, a plurality of slots for attaching the tape feeders 12 are arranged in parallel, and the tape feeders 12 are set in parallel in accordance with feeder addresses which indicate previously allocated positions of the slots. The carriage 9 includes reel mounting positions 9b such that one reel 10 is mountable to correspond to each of the tape feeders 12.

A feeder main body 12a of each of the tape feeders 12 includes: a tape feed mechanism which feeds the carrier tape 11 pitch by pitch; and a feeder control unit (not shown) which controls the tape feed mechanism. On an upper surface of the feeder main body 12a, an operating portion 13 (see FIG. 3) is provided. The operating portion 13 allows various operations such as a tape feeding operation. The feeder control stores therein a feeder ID which individually specifies the tape feeder 12. When tape feeder 12 is attached to the feeder base 9a, the feeder ID of the tape feeder 12 is detected. Accordingly, the attached tape feeder 12 can be specified for each of the feeder addresses.

When the tape feeder 12 is attached to the carriage 9 at the time of a changeover of kind of product or a supply of the new component, since the plurality of tape feeders 12 are adjacently arranged at narrow pitches, an error in setting in which the adjacent tape feeders 12 are taken as one for another and attached by mistake may occur. In the present exemplary embodiment, in order to reduce the occurrence of such an error in setting as much as possible, a barcode label as an identification mark which identify the kind of the component is stuck to the reel 10 as described below. When the tape feeder 12 is attached to the carriage 9 or when the reel 10 is replaced by a new reel, a result of the identification marks read by the operator using a barcode reader 16 is compared with previously stored data of the kind of the component. Accordingly, the error in setting is suppressed as much as possible.

Figure 3:
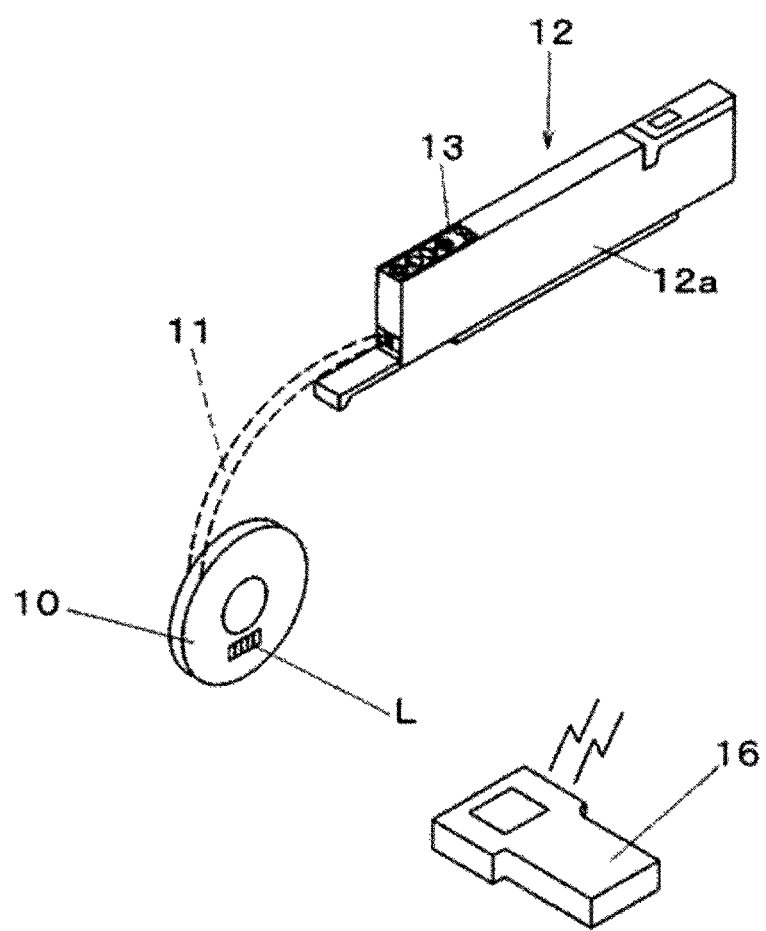
FIG. 3 is an explanatory view of a component checking operation in the component mounting device of the exemplary embodiment of the present invention.

FIG. 3 shows a function of the tape feeder 12 and a reading operation of the barcode label serving as the identification mark in the component supply unit 8. When the tape feeder 12 is attached to the carriage 9 or when the reel 10 is replaced by a new reel due to the changeover of the kind of the product or the supply of the new component, the carrier tape 11 is pulled out from the reel 10 mounted on the reel mounting position 9b and set to the tape feeder 12. The barcode label L showing the kind of the component accommodated in the reel is stuck to the reel 10.

When the tape feeder 12 is attached to the carriage 9 or when the reel 10 is replaced by another reel, the above-described barcode label L is read by the barcode reader 16. The read result is transmitted to the host system 3 through the wireless receiver 4. Further, a checking process is performed by the component mounting devices M2 to M4 to which the signal is transmitted from the host system 3 to determine whether it is proper to perform a feeder attaching operation or a reel setting operation.

Figure 4:
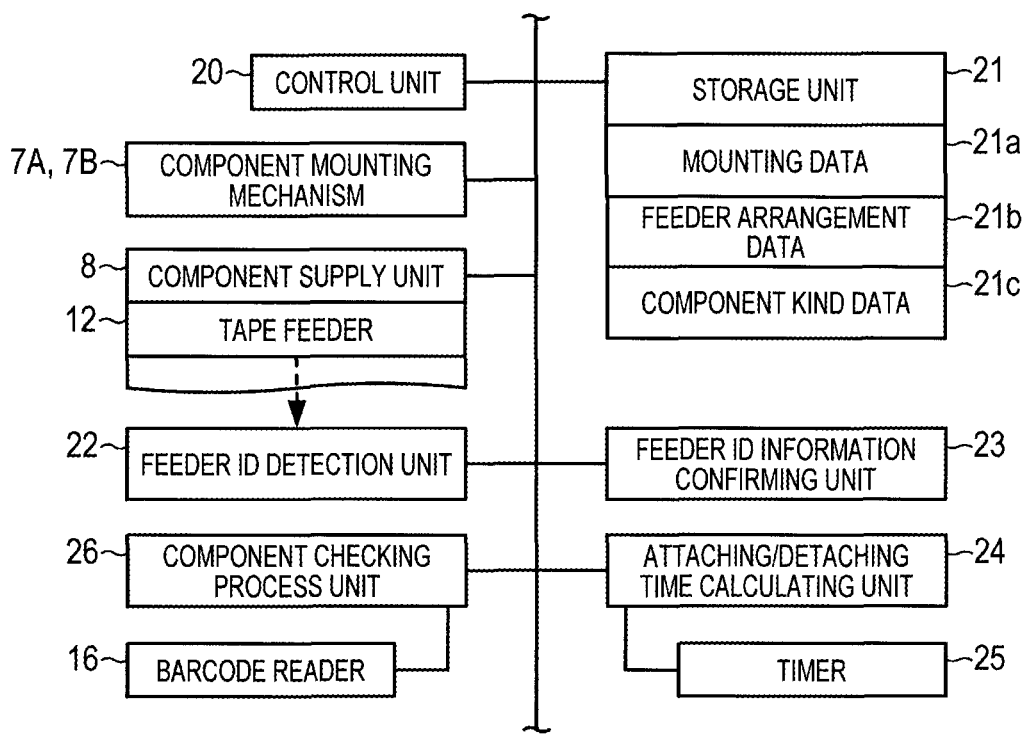
FIG. 4 is a block diagram showing a configuration of a control system of the component mounting device of the exemplary embodiment of the present invention.

With reference to FIG. 4, a control system of each of the component mounting devices M2 to M4 will be described. In FIG. 4, a control unit 20 is an arithmetic processor having a CPU function to execute processing programs stored in a storing unit 21 so as to control the units described below. In a control process, the control unit 20 refers to various kinds of data such as mounting data 21a, feeder arrangement data 21b and component kind data 21c stored in the storing unit 21.

The mounting data 21a indicate data of the kind of the electronic component to be mounted and/or a coordinate of a mounting position of the board and is stored for each kind of board as an object to be manufactured. The feeder arrangement data 21b indicate data which specify an arrangement of the parts feeder such as the tape feeder 12 in the component supply unit 8, namely, data containing the feeder address specifying a mounting position of the tape feeder 12 on the feeder base 9a of the carriage 9 in association with the feeder ID serving as identifying information for specifying each tape feeder 12. The component kind data 21c indicate data which specify the kind of the component to be fed from the feeder address for each feeder address in the tape feeder 12.

A feeder ID detecting unit 22 detects the feeder ID of the tape feeder 12 attached to the feeder base 9a in the component supply unit 8. Namely, when the tape feeder 12 is attached to the feeder base 9a, the feeder ID stored in the feeder control unit of the tape feeder 12 is read by the feeder ID detecting unit 22. In a feeder temporarily detaching operation in which the tape feeder 12 which was attached to the feeder base 9a is temporarily detached and attached again to the same attaching position having the same feeder address while a mounting operation is performed, a feeder ID information confirming unit 23 confirms whether the tape feeder 12 before the detachment is the same as the tape feeder 12 after the detachment. In other words, after the tape feeder 12 is reattached, the feeder ID detecting unit 22 detects the feeder ID which individually specifies the tape feeder 12 to confirm whether the reattached tape feeder 12 is the same as the prior tape feeder 12.

When the feeder ID information confirming unit 23 confirms that the reattached tape feeder 12 is the same as the prior tape feeder 12, an attaching/detaching time calculating unit 24 performs a calculation to obtain an attaching/detaching time from the detachment of the tape feeder 12 to the reattachment of the tape feeder 12. Namely, the attaching/detaching time calculating unit 24 records a time when the tape feeder 12 is detached and a time when the tape feeder 12 is attached again by a timer 25 to calculate the attaching/detaching time in accordance with a difference between these times. The attaching/detaching time may be calculated in accordance with a timer value obtained by turning on the timer when the tape feeder 12 is detached and turning of the timer when the tape feeder 12 is reattached.

A component checking process unit 26 compares the kind of the component obtained by reading the barcode label L using the barcode reader 16 with the component kind data 21c stored in the storing unit 21 with reference to the data. Thus, the component checking process unit 26 performs a process which checks whether the reel 10 as an object to be checked is a regular reel 10 to be set to the tape feeder 12 attached to the feeder address.

In the present exemplary embodiment, when the attaching/detaching time calculated by the attaching/detaching time calculating unit 24 is a previously set given time or shorter, the control unit 20 controls the component mounting mechanisms 7A and 7B to perform the mounting operations without performing a component checking operation to determine whether the kind of the electronic component accommodated in the tape feeder 12 is correct. Here, the given time is set, for example, to a time during which it is supposed to be practically impossible to complete an exchange work of the reel 10 in the tape feeder 12. That is, when the attaching/detaching time falls within the given time which is set as described above, it can be determined that there is no possibility that the reel 10 is exchanged for a new reel in the tape feeder 12.

Now, with reference to FIG. 5, a feeder temporarily detaching process in a mounting operation of the component by the component mounting system 1 will be described below. In the feeder temporarily detaching process, one tape feeder 12 which was attached to the feeder base 9a is temporarily detached during the mounting operation for the purpose of confirming whether there is an abnormality when a suction error occurs at the time of picking up the component, and then, attached again to the same attaching position having the same feeder address in a component mounting method for performing the component mounting work in which the electronic component is picked up from the tape feeder 12 attached to the feeder base 9a of the component supply unit 8 and which is mounted on the board.

Figure 5:
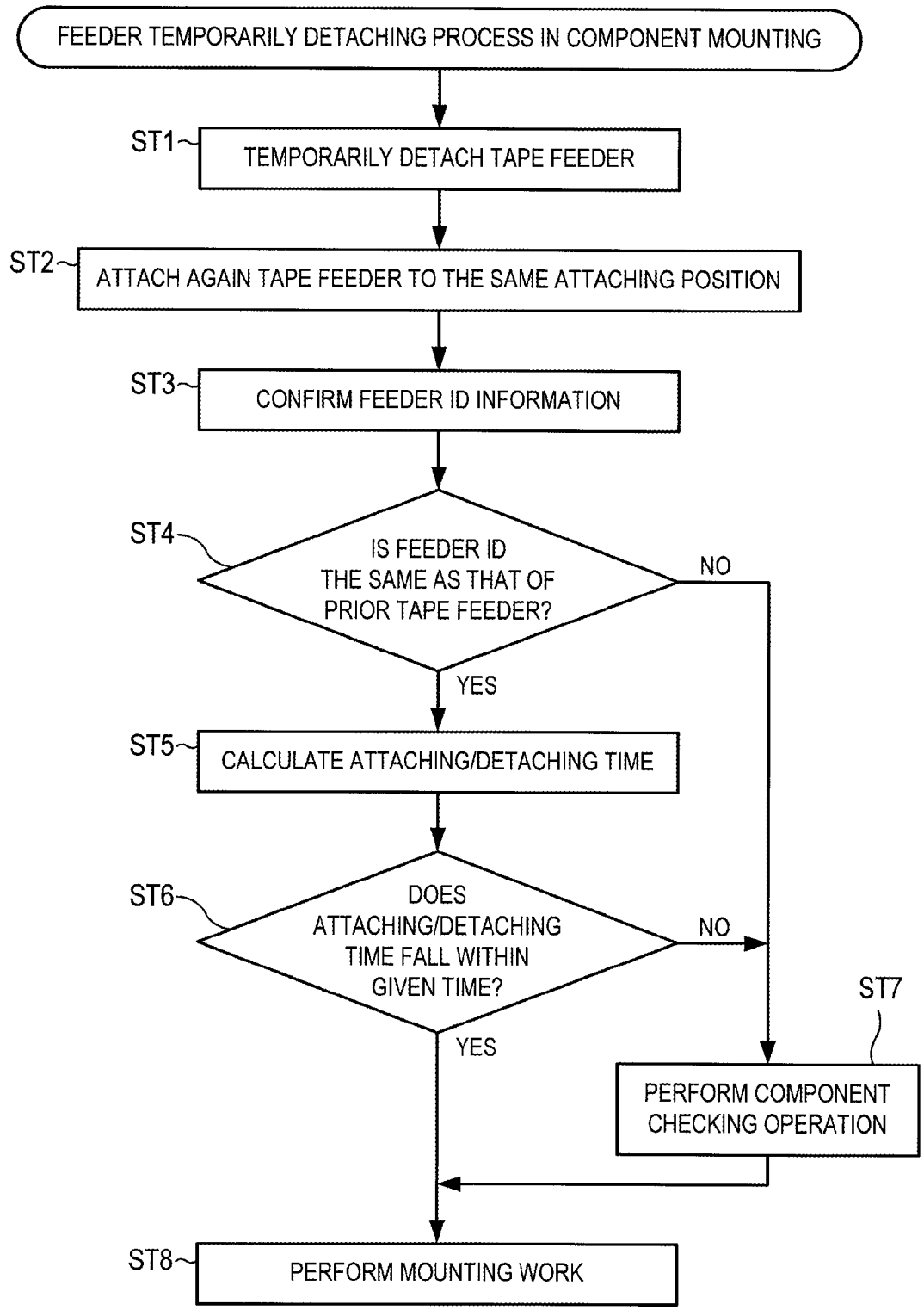
FIG. 5 is a flowchart showing a feeder temporarily detaching process in a component mounting method of the exemplary embodiment of the present invention.

As shown in FIG. 5, the tape feeder 12 (prior tape feeder) is temporarily detached owing to the above-described reason or the like (ST 1). Then, after a prescribed process is performed, the detached tape feeder 12 is attached again to the same attaching position (ST 2). After the tape feeder 12 is reattached, the feeder ID detecting unit 22 detects feeder ID information which individually specifies the tape feeder 12, and confirms whether the feeder ID of the reattached tape feeder 12 is the same as the feeder ID of the tape prior feeder 12 which was attached and then detached (a feeder ID information confirming process) (ST 3).

That is, whether the feeder ID of the reattached tape feeder 12 is the same as the feeder ID of the tape feeder 12 which is previously attached is determined by comparing the detected feeder ID with the feeder ID corresponding to the same feeder address in the feeder arrangement data 21*b* (ST 4). Here, when the detected feeder ID is the same as the feeder ID corresponding to the same feeder address, the attaching/detaching time is calculated from the detachment of the tape feeder 12 to the reattachment of the tape feeder 12 (an attaching/detaching time calculating process) (ST 5). That is, the times when the (ST 1) and (ST 2) are performed are measured by the timer 25 to obtain the difference between these times and to calculate the attaching/detaching time by the attaching/detaching time calculating unit 24.

Then, it is determined whether the attaching/detaching time falls within the given time which is set as described above (ST 6). If the attaching/detaching time falls within the given time, it is determined that there is no possibility of the exchange of the reel 10 for a new reel, and the mounting operations by the component mounting mechanisms 7A and 7B are performed (ST 8). In contrast, if the attaching/detaching time exceeds the given time in the step (ST 6), or if it is determined that the feeder ID of the reattached tape feeder 12 is not the same as the feeder ID of the prior tape feeder 12 which was attached in the step (ST 4), the component checking operation is performed (ST 7).

In other words, if the feeder IDs are not identical to each other, it is determined that a different tape feeder 12 different from the prior tape feeder 12 is attached due to any cause. Thus, it is necessary to confirm whether the tape feeder 12 is a tape feeder to which a proper reel 10 is set. If the attaching/detaching time exceeds the given time, although the tape feeder 12 is the same as the prior tape feeder 12 which was attached, it is not possible to eliminate a possibility that the reel 10 is replaced by a new reel while the operator does not become aware thereof since the attaching/detaching time exceeds a time necessary for replacing the reel 10 by a new reel.

Therefore, in any of the above-described cases, the kind of the component obtained by reading the barcode label L by the barcode reader 16 is compared with the component kind data 21*c* to check whether the kind of the component is a proper kind of component. If it is determined that the kind of the component is the proper kind of the component, the process proceeds to the step (ST 8) to perform the mounting operations. In the (ST 7), if it is determined that the kind of the component is not the proper kind of the component, the operator suitably decides that the reel 10 is replaced by a reel 10 of the proper kind of the component or the mounting operation is temporarily interrupted.

As described above, for the component mounting method and the component mounting device shown in the present exemplary embodiment, in the feeder temporarily detaching operation in which the component feeder 12 is temporarily detached from the feeder base and reattached to the same attaching position while the mounting operation is performed, after the tape feeder is attached again to the feeder base, the feeder ID information which individually specifies the tape feeder 12 is detected to confirm whether the reattached tape feeder 12 is the same as the prior tape feeder 12 which was attached to and then detached from the feeder base. If it is confirmed that the reattached tape feeder 12 is the same as the prior tape feeder 12 which was attached to and then detached from the feeder base, the attaching/detaching time from the detachment of the tape feeder 12 to the reattachment of the tape feeder 12 is calculated. If the calculated attaching/detaching time is the given time or shorter, the mounting operation is performed without performing the component checking operation for deciding whether the kind of the electronic component accommodated in the tape feeder 12 is correct. Since an execution of an unnecessary component checking operation is eliminated, a working load can be reduced and a working efficiency can be improved in the temporary detachment of the tape feeder 12.

The above-described exemplary embodiment shows a structure example in which the feeder temporarily detaching process is performed by processing functions of the component mounting devices M2 to M4 in the component mounting system 1. However, the component mounting method of the present invention is not limited to this structure. The host system 3 may have a processing function which performs the feeder temporarily detaching process. In this case, all or a part of processing functions of the storing unit 21 which stores the feeder arrangement data 21*b* and the component kind data 21*c*, the feeder ID information confirming unit 23, the attaching/detaching time calculating unit 24 and the component checking process unit 26 are provided in the host system 3.

The component mounting method and the component mounting device of the present embodiment can effectively reduce a working load and improve a working efficiency when the parts feeder is temporarily detached, and are applicable to an electronic component mounting field of a type in which the component is fed by carrier tapes.

What is claimed is:

1. A component mounting method for performing a mounting work in which an electronic component is picked up from a parts feeder attached to a feeder base of a component supply unit and is mounted on a board,
said component mounting method comprising:
detecting feeder ID information of a second parts feeder, which individually specifies a parts feeder, after the second parts feeder is attached to an attaching position of the feeder base having a feeder address, and confirming whether the second parts feeder is the same as a first parts feeder which was attached to and then detached from the attaching position having the same feeder address during the mounting work based on the detected feeder ID information; and
calculating an attaching/detaching time from detachment of the first parts feeder to attachment of the second parts feeder if it is confirmed that the second parts feeder is the same as the first parts feeder,
wherein if the calculated attaching/detaching time is a given time or shorter, the mounting work is performed without performing a component checking operation which determines whether a kind of an electronic component accommodated in the second parts feeder is proper.

2. The component mounting method according to claim 1,
wherein the attaching/detaching time is calculated in accordance with a difference between a time when the first parts feeder is detached and a time when the second parts feeder is attached.

3. A component mounting device for performing a mounting work in which an electronic component is picked up from a parts feeder attached to a feeder base of a component supply unit and is mounted on a board, the component mounting device comprising:
a component mounting mechanism which performs the mounting work;
a feeder ID information confirming unit which detects feeder ID information, which individually specifies a parts feeder, after a second parts feeder is attached to an attaching position of the feeder base having a feeder address, and which confirms whether the second parts feeder is the same as a first parts feeder which was attached to and then detached from the attaching position having the same feeder address during the mounting work;

an attaching/detaching time calculating unit which calculates an attaching/detaching time from detachment of the first parts feeder to attachment of the second parts feeder if the feeder ID information confirming unit confirms that the second parts feeder is the same as the first parts feeder; and a control unit which controls the component mounting mechanism, the feeder ID information confirming unit and the attaching/detaching time calculating unit, wherein if the calculated attaching/detaching time is a given time or shorter, the control unit controls the component mounting mechanism to perform the mounting work without performing a component checking operation which determines whether a kind of an electronic component accommodated in the second parts feeder is proper.

4. The component mounting device according to claim 3, wherein the attaching/detaching time is calculated in accordance with a difference between a time when the first parts feeder is detached and a time when the second parts feeder is attached.

* * * * *